(12) United States Patent
Perthold et al.

(10) Patent No.: US 6,657,492 B1
(45) Date of Patent: Dec. 2, 2003

(54) SYSTEM FOR ESTIMATING A NON-LINEAR CHARACTERISTIC OF AN AMPLIFIER

(75) Inventors: Rainer Perthold, Weisendorf (DE); Heinz Gerhauser, Waischenfeld (DE); Gerald Ulbricht, Röthenbach (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/508,654

(22) PCT Filed: Feb. 24, 2000

(86) PCT No.: PCT/EP00/01540
§ 371 (c)(1),
(2), (4) Date: May 1, 2000

(87) PCT Pub. No.: WO01/63751
PCT Pub. Date: Aug. 30, 2001

(51) Int. Cl.[7] .................................................. H03F 1/26
(52) U.S. Cl. ........................... 330/149; 330/2; 375/297; 455/63
(58) Field of Search ...................... 330/2, 149; 375/297; 455/63

(56) References Cited

FOREIGN PATENT DOCUMENTS

| EP | 0 658 975 A | 6/1995 |
|---|---|---|
| WO | WO 99/66637 A | 12/1999 |
| WO | WO 00/01065 A | 1/2000 |

*Primary Examiner*—Henry Choe
(74) *Attorney, Agent, or Firm*—Dougherty, Clements & Hofer

(57) ABSTRACT

In a method for estimating a non-linear characteristic of an amplifier, an input signal is provided, a reference signal is determined based on the power of the input signal, the input signal is amplified using said amplifier in order to produce an amplified signal, a measurement signal is determined based on the power of the amplified signal and respective samples of the measurement signal are associated with respective samples of the reference signal. A gain value of said amplifier for each sample is determined from the respective samples of the reference signal and the measurement signal. An operating range of the amplifier is divided into a plurality of power sections and an averaged gain value is produced for each power section. Thereafter, a measure of the deviation of the gain values associated with a power section from said averaged gain value is determined. Then, averaged gain values are rejected which have a measure of the deviation which exceeds a predetermined threshold. Finally, an interpolation is performed using averaged gain values which have not been rejected in order to produce an estimation of said non-linear characteristic of said amplifier.

12 Claims, 2 Drawing Sheets

SYSTEM FOR ESTIMATING A NON-LINEAR CHARACTERISTIC OF AN AMPLIFIER

BACKGROUND OF THE INVENTION

1. Field of the Invention

The present invention relates to a method and an apparatus for estimating a non-linear characteristic of an amplifier and, in particular, to a method and an apparatus which can be used in linearizing non-linear power amplifiers as used in transmitters for digital broadcasting, satellite communications or mobile communications.

The present invention can be used for estimating a non-linear characteristic of an amplifier in case of input signals formed using modulation methods which result in a non-constant envelope of the radio frequency carrier signal. Thus, the present invention preferably finds use with respect to transmitters for digital broadcasting, which are fed by multi-carrier signals, such as OFDM signals (OFDM= orthogonal frequency division multiplex), for example. With such signals, the non-linearity of the amplifier causes unwanted frequency portions of the signal at the output of the amplifier. Such frequency portions interfer with adjacent-frequency channels.

In addition, the present invention is applicable to mobile communication systems using CDMA signals (CDMA= code division multiple access), for example. Additionally, the present invention can be advantageously used in satellite earth stations or base stations of mobile telephone systems.

2. Description of Prior Art

U.S. Pat. No. 5,049,832 relates to a system for the linearization of power amplifiers using a look-up table. The look-up table contains complex pre-distortion values to be applied to an input signal of the power amplifier in order to provide a pre-distortion of the input signal which compensates for distortions caused by the power amplifier with respect to magnitude and phase. U.S. Pat. No. 5,049,832 teaches several methods used to appropriately establish the contents of the look-up table. The prior art methods suffer from the disadvantage that errors occuring when measuring the non-linearity affect the pre-distortion coefficients stored in the look-up table such that the linearization gain which can be achieved is reduced. In an extreme case, the linearity of the power amplifier can even deteriorate.

SUMMARY OF THE INVENTION

It is the object of the present invention to provide a method and an apparatus for estimating a non-linear characteristic of an amplifier wherein the influence of errors during the measurement of the non-linearity is reduced.

In accordance with a fist aspect of the invention, this object is achieved by a method for estimating a non-linear characteristic of an amplifier, comprising the steps of:

providing an input signal;

determining a reference signal based on the power of the input signal;

amplifying the input signal or a signal derived from the input signal using the amplifier to produce an amplified signal;

determining a measurement signal based on the power of the amplified signal;

associating respective samples of the measurement signal with respective samples of the reference signal;

determining a gain value of the amplifier for each sample from the respective sample of the reference signal and the associated sample of the measurement signal;

dividing an operating range of the amplifier into a plurality of power sections;

for each power section, averaging the gain values associated with samples of the reference signal, which have a power which lies in the respective power section, in order to produce an averaged gain value;

for each power section, determining a measure of the deviation of the associated gain values from the averaged gain value;

rejecting an averaged gain value which has a measure of the deviation which exceeds a predetermined threshold; and performing an interpolation using averaged gain values which have not been rejected in order to produce an estimation of the non-linear characteristic of the amplifier.

In accordance with a second aspect of the invention, this object is achieved by an apparatus for estimating a non-linear characteristic of an amplifier, comprising:

means for determining a reference signal based on the power of an input signal;

means for determining a measurement signal based on the power of an amplified signal, said amplified signal being said input signal or a signal derived from said input signal amplified by said amplifier;

means for associating respective samples of said measurement signal with respective samples of said reference signal;

means for determining a gain value of said amplifier for each sample from the respective sample of said reference signal and said associated sample of said measurement signal;

means for dividing an operating range of said amplifier into a plurality of power sections;

means for averaging the gain values associated with samples of said reference signal which have a power which lies in a respective power section, in order to produce an averaged gain value for each power section;

means for determining a measure of the deviation of the associated gain values from said averaged gain value for each power section;

means for rejecting an averaged gain value which has a measure of the deviation which exceeds a predetermined threshold; and means for performing an interpolation using averaged gain values which have not been rejected in order to produce an estimation of said non-linear characteristics of said amplifier.

The present invention is particularly suited for estimating the non-linear characteristic of a power amplifier in a transmitter output stage, wherein a non-linear phase characteristic and a non-linear magnitude characteristic of the power amplifier can be obtained. This is achieved by determining a complex gain value of the power amplifier which has a magnitude and a phase. In such a case, an averaged magnitude and an averaged phase are determined for each power section and a measure of the deviation of the magnitudes from the averaged magnitude and a measure of the deviation of the phase from the averaged phase are determined for each power section. If the measure of the deviation of the magnitudes from the averaged magnitude exceeds a predetermined threshold, the associated averaged magnitude will be rejected. If the measure of the deviation of the phases from the averaged phase exceeds a predetermined threshold, the associated averaged phase is rejected. Finally, an interpolation is performed in order to establish values for the rejected averaged magnitudes and the rejected averaged phases in order to produce an AM/AM characteristic and an AM/PM characteristic of the power amplifier.

Thus, according to the present invention, the reliability of the measured value, that is of the measurement signal, is considered such that the usage of an erroneous measurement in estimating a non-linear characteristic of an amplifier can be avoided.

The method and the apparatus according to the present invention is insensitive to measuring errors occuring in practice when a reference signal and a measurement signal for estimating non-linearities of a power amplifier are determined. Such errors can occur due to noise of analog-to-digital converters and other circuit elements preceding the power amplifier, phase noise caused by the upconverter preceding the power amplifier or caused by the sampling clock of the analog-to-digital converter preceding the power amplifier. In addition, a memory effect of the power amplifier or the preceding upconverter due to the usage of surface acoustic wave filters can cause measuring errors. Finally, a non-optimal estimation of a delay or a possible frequency shift between measurement signal and reference signal may be the reason for measuring errors. Since the present invention reduces the influence of such measuring errors to the estimation of the non-linearity of the amplifier, less expensive elements can be used in the output stage, for example, less expensive upconverters or analog-to-digital converters.

BRIEF DESCRIPTION OF THE DRAWINGS

Preferred embodiments of the present invention are explained hereinafter referring to the enclosed figures, in which.

DESCRIPTION OF PREFERRED EMBODIMENTS OF THE INVENTION

Figure 1:
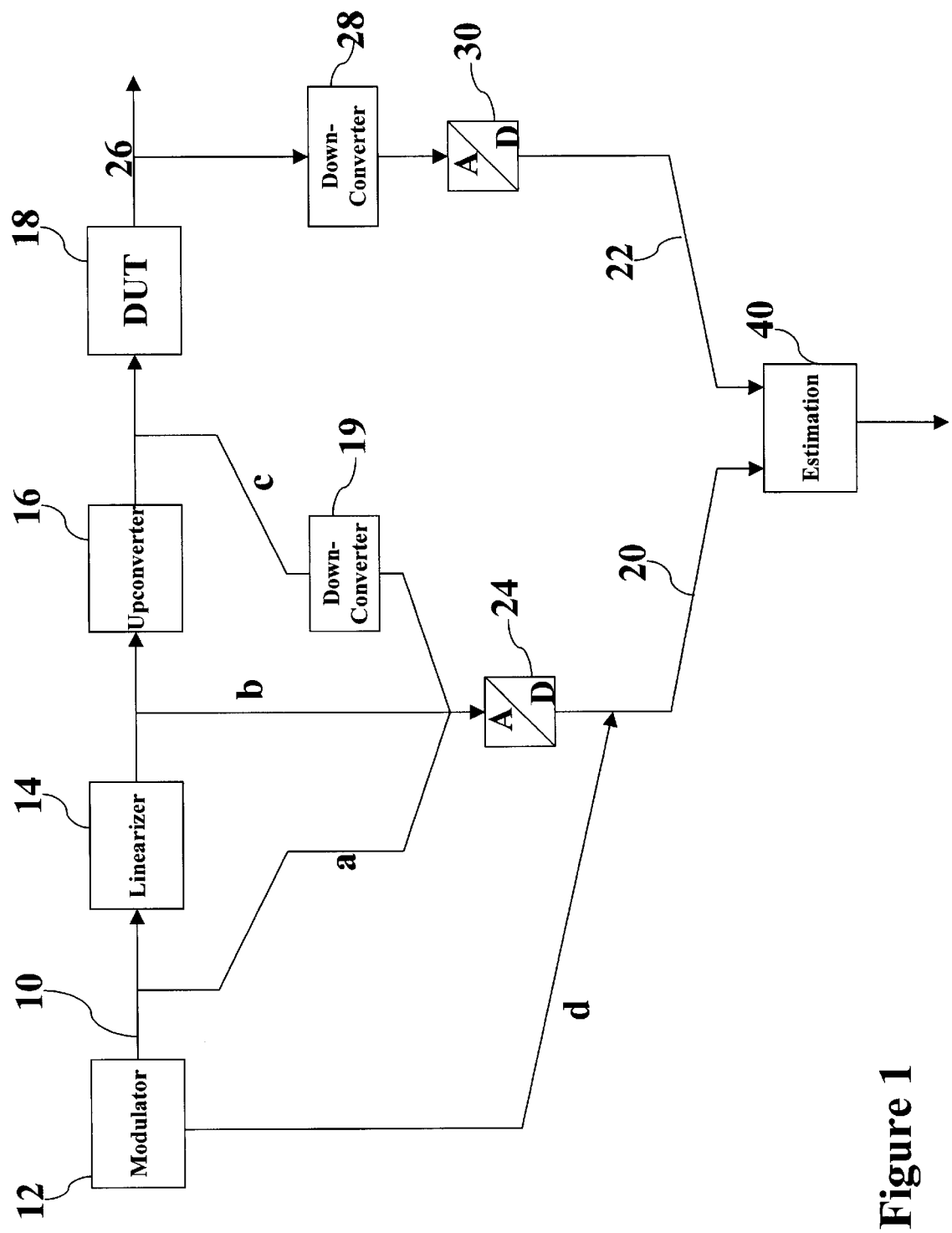
FIG. 1 shows a schematic representation of a circuit for estimating a non-linear characteristic of an amplifier according to the present invention.

Although the present invention is described hereinafter with respect to the estimation of the non-linear characteristic of a power amplifier of a transmitter output stage, it is to be noted that the present application equally applies for estimating the non-linear characteristic of amplifiers other than power amplifiers.

As can be seen from the Figure of the present invention, an input signal 10 is provided by a modulator 12. The modulator 12 can be a modulator for providing an OFDM signal, for example. The output of the modulator 12 is connected to the input of a linearizer 14, the output of which is connected to an upconverter 16. The output of the upconverter 16 is connected to a power amplifier 18, the non-linearity of which is to be estimated. Thus, the power amplifier 18 can be referred to as the device under test, DUT. The linearizer 14 is preferably provided in order to perform a predistortion of the input signal 10 such that distortions caused by the non-linearity of the power amplifier 18 are compensated for. The upconverter is used in order to convert a signal to be transmitted via the power amplifier 18 into the radio frequency range using a carrier frequency.

In order to provide an estimation of the non-linearity of the power amplifier 18, a reference signal 20 and a measurement signal 22 have to be determined. The Figure shows four possibilities (a), (b) and (c) for deriving a signal from the signal path between the modulator 12 and the power amplifier 18 in order to determine a reference signal 20. In either case, the derived signal is applied to an analog-to-digital converter which can be regarded as an envelope detector and a quantization means such that digital samples are output by the analog-to-digital converter 24. In practice, only one of the signal paths (a), (b) and (c) will be used to derive the reference signal. Signal path (a) is connected to the output of the modulator 12, signal path (b) is connected to the output of the linearization means 14 and signal path (c) is connected to the output of the upconverter 16. In signal path (c), a down converter 19 is provided preceding the analog-to-digital converter 24.

Alternatively, the reference signal 20 could be directly aderived from the modulator 12 as it is shown by a signal path (d) in the Figure.

The measurement signal 32 is derived at the output of the power amplifier 18. The output signal 26 of the power amplifier 18 is applied to a down converter 28 for mixing the output signal 26 into the base band. The output of the down converter 28 is connected to the input of an analog-to-digital converter 30 wherein the measurement signal is output by the analog-to-digital converter 30. The mode of operation of the analog-to-digital converter 30 preferably corresponds to the mode of operation of the analog-to-digital converter 24. Alternatively, the measurement signal 32 can be obtained by under-sampling using a comb generator. In a further embodiment, the measuring signal can be derived using a bandpass sampling in the analog-to-digital converter.

In the estimation block 40, signal processing of the reference signal 20 and the measurement signal 22 is conducted so that the estimation block can be comprised of any appropriate signal processing apparatus.

From the reference signal 20 and the measurement signal 22, the non-linearity of the power amplifier 18 is estimated in an estimation block 40. The estimation block 40 is adapted in order to perform optional steps with respect to the reference signal 20 and the measurement signal 22, if necessary. Firstly, a correction of frequency shifts between the measurement and the reference signal is performed, if necessary. In addition, the reference signal will be processed using a model of the linearization means 14, if the reference signal 20 is derived via signal path (b). Similarly, the reference signal will be processed using a model of the linearization means 14 and a model of the upconverter 16 if the reference signal 20 is derived via signal path (c). If the measurement signal is derived using a bandpass sampling, a band width reduction and a frequency conversion of the measurement signal into the complex base band is performed. If the reference signal is taken at the output of the upconverter 16 and a bandpass sampling is conducted with respect to the reference signal, a band width reduction and a frequency conversion of the reference signal into the complex base band is performed. Finally, possible time delays and phase shifts between the reference signal and the measurement signals are determined using a cross correlation and are compensated for using an interpolation, for example.

Means for determining a reference signal 20 are shown in FIG. 1 as an analog to digital converter 24 and a down converter 19. Means for determining a measurement signal are shown as a down converter 28 and an analog to digital converter 30.

Figure 2:
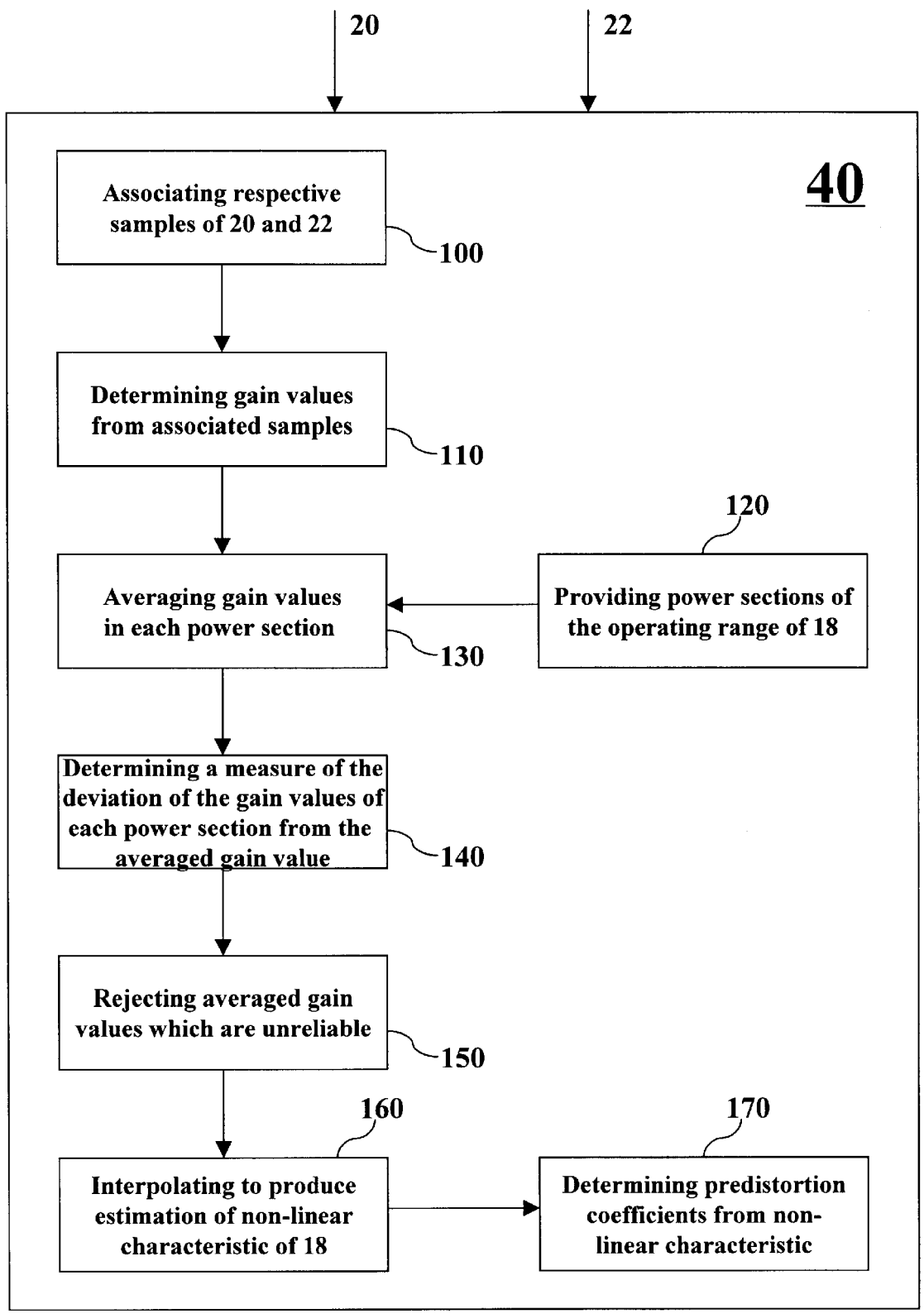
FIG. 2 shows a schematic representation of the estimation block 40 of FIG. 1.

A schematic representation of the estimation block 40 of FIG. 1 is shown in FIG. 2 in the form of a flow chart. The respective steps shown in FIG. 2 can be conducted by any appropriate single processing apparatus.

At step 100, respective samples of the reference signal and the measurement signal 22 are associated to each other. At step 110, gain values of the amplifier 18 are determined for each sample from the respective sample of the reference signal and the associated sample of the measurement signal. At step 120, power sections of the operating range of the amplifier 18 are provided by dividing the operating range into a plurality of power sections. At step 130, the gain values in each power section are averaged. At step 140, a measure of the deviation of the gain values for each power section from the averaged gain value of that power section is determined. At step 150, averaged gain values which are unreliable are rejected. At step 160, an interpolation is performed in order to produce an estimation of the non-linear characteristic of the amplifier 18. Finally, at step 170, predistortion coefficients are determined from the non-linear characteristic.

After the optional steps mentioned above have been conducted, each complex sample x(t) of the reference signal 20 is associated with a corresponding complex sample y(t) of the measurement signal 22. Thereafter, the complex gain g(t) of the power amplifier 18 for each sample is determined on the basis of the respective samples of the reference signal 20 and the measurement signal 22.

According to prior art approaches, the complex gain of the power amplifier determined in this way is used in order to determine pre-distortion coefficients for the look-up table of the linearization means.

According to the present invention, an operating range of the power amplifier 18 is divided into a plurality of power sections, i.e., preferably the entire operating range of the amplifier is divided in power sections. For each power section, the magnitudes of the complex gain of those samples, the power of the reference signals of which lies within that power section are averaged in order to extract check points for the AM/AM characteristic of the power amplifier. In addition, the phases of the complex gain of those samples, the power of the reference signals of which lies within that power section, are averaged in order to extract check points for the AM/PM characteristic of the power amplifier. Preferably, the check point, i.e., $\bar{g}_A(m)$, is associated with a power value $P_m$ and is associated with the midpoint of the power section with which the respective check point is associated. However, the respective check points can be associated with other parts of a respective power section, the left hand boundary or the right hand boundary thereof, for example. Thus, the averaged magnitude associated with the power section m and the averaged phase associated with the power section m can be described as follows:

$$\bar{g}_A(m) = \frac{1}{K}\sum_{n=1}^{K}|\underline{g}(t_n)|$$

for all $$(P_m-\Delta P) < |x(t_M)| < (P_m+\Delta P)$$

and $$\angle g_A(m) = \frac{1}{K}\sum_{n=1}^{K}\arg(\underline{g}(t_n))$$

for all $$(P_m-\Delta P) < |x(t_n)| < (P_m+\Delta P)$$

wherein K is the number of samples within a power section m, $g(t_n)$ is the magnitude of the complex power of the sample m, $\arg(g(t_n))$ is the phase of the complex gain of the sample m, $\Delta P$ is half the width of a power section.

According to the present invention, a measure of the deviation of the magnitudes and phases of the sample of each power section with respect to the averaged magnitude and the averaged phase of this section is estimated. In preferred embodiments of the present invention, the measure of the deviation is an estimation of the standard deviation of the magnitudes and phases of the complex gain associated with those samples lying within this power section. Such a measure of the deviation for the magnitudes and phases can be obtained according to the following equations:

$$\sigma_{\bar{g}_A}(m) = \sqrt{\frac{1}{K-1}\sum_{n=1}^{K}|\underline{g}(t_n)|^2 - \bar{g}_A(m)^2}$$

for all $$(P_m-\Delta P) < |x(t_n)| < (P_m+\Delta P)$$

and $$\sigma_{\angle g_A}(m) = \sqrt{\frac{1}{K-1}\sum_{n=1}^{K}(\arg(\underline{g}(t_n)))^2 - \angle g_A(m)^2}$$

for all $$(P_m-\Delta P) < |x(t_n)| < (P_m+\Delta P)$$

wherein $\sigma_{\bar{g}_A}(m)$ is the estimated standard deviation of the magnitudes of the complex gain values in the power section m and $\angle_{g_A}(m)$ is the estimation of the standard deviation of the phases of the gain values in the power section m.

As has been explained above, each power section has two checkpoints associated therewith, one corresponding to the averaged magnitudes of the gain values inside that power section and one corresponding to the averaged phases of the gain values within that power section. The first checkpoints corresponding to the averaged magnitudes are used as checkpoints for the AM/AM characteristic of the power amplifier, whereas the second checkpoints corresponding to the averaged phases are used as checkpoints for the AM/PM characteristic of the power amplifier.

In a next step, all checkpoints are rejected which have a standard deviation of the magnitudes or of the phases which exceed a predetermined value. To be more specific, all first checkpoints are rejected which have a standard deviation of the averaged magnitude exceeding a predetermined value. Moreover, all section checkpoints are rejected which have a standard deviation of the averaged phases which exceeds a predetermined value. The values for the standard deviations of the averaged magnitudes and the averaged phases may be identical or different from each other.

After the rejection of the respective checkpoints, an interpolation of the checkpoints which have not been rejected is conducted in order to reconstruct such checkpoints which have been rejected in the preceding step. To this end, the remaining checkpoints of the AM/AM characteristic ($P_m \rightarrow P_m + \bar{g}_A(m)$) and of the AM/PM characteristic ($P_m \rightarrow \angle g_A(m)$) can be interpolated using cubic splines or using a linear interpolation. Preferably, an AM/AM characteristic and an AM/PM characteristic having finer resolutions are generated using an appropriated interpolation.

Thus, the present invention provides a method and an apparatus for estimating a non-linear characteristic of an amplifier in which influences of measuring errors on the result of the estimation can be reduced. If the estimation of the non-linear characteristic of the power amplifier is to be used in order to determine pre-distortion coefficients for a pre-distorter, the required inverse function can easily be obtained prior to the interpolation of the AM/AM characteristic and the AM/PM characteristic by exchanging the coordinates of the checkpoints, i.e., by exchanging input and output values.

To summarize, the non-linearity of an amplifier is estimated according to the invention by recording the input signal and the output signal of the amplifier, compensating for time delays and phase shifts between the signals at the input and the output of the amplifier, associating all samples of the input signals with samples of the output signal, averaging respective input and output values in order to provide an AM/AM characteristic and an AM/PM characteristic having a number of respective checkpoints, for example 128, assessing the reliability of the checkpoints using standard deviations of magnitudes and phases, selecting checkpoints which are sufficiently reliable and interpolating the checkpoints assessed as sufficiently reliable in order to produce the AM/AM and AM/PM characteristics.

According to the embodiment described above, checkpoints for the AM/AM characteristic will be rejected in case the measure of the deviation of the corresponding averaged magnitude exceeds a predetermined threshold and checkpoints for the AM/PM characteristic will be rejected in case the measure of the deviation of the corresponding averaged phase exceeds a predetermined threshold. In alternative embodiments of the invention, only one checkpoint can be provided, either for the AM/AM characteristic or the AM/PM characteristic. In such case interpolation of both, magnitude and phase, will be performed for a corresponding power section in case the measure of the deviation of the single checkpoint exceeds a predetermined threshold. Moreover, in further embodiments of the present invention, checkpoints for the AM/AM characteristic and checkpoints for the AM/PM characteristic can be provided and both checkpoints associated with a power section can be rejected in case the measure of deviation of only one of the checkpoints exceeds a predetermined threshold.

Although the present invention has been described herein referring to polar coordinates, magnitude and phase, the present invention can be practiced using Cartesian coordinates as well. However, in such case, the interpolation is more difficult to perform.

In FIG. 1 of the present application, the linearization means is provided in the base band region. Contrary thereto, the linearization means can be provided directly in the radio frequency region or in an intermediate frequency region or in an intermediate frequency region. In such a case, the reference signal is derived in a manner analog to the manners described with respect to FIG. 1 of the present application.

What is claimed is:

1. A method for estimating a non-linear characteristic of an amplifier, comprising the steps of:
   (a) providing an input signal;
   (b) determining a reference signal based on the power of said input signal;
   (c) amplifying said input signal or a signal derived from said input signal using said amplifier to produce an amplified signal;
   (d) determining a measurement signal based on the power of said amplified signal;
   (e) associating respective samples of said measurement signal with respective samples of said reference signal;
   (f) determining a gain value of said amplifier for each sample from the respective sample of said reference signal and said associated sample of said measurement signal;
   (g) dividing an operating range of said amplifier into a plurality of power sections;
   (h) for each power section, averaging the gain values associated with samples of said reference signal which have a power which lies in said respective power section, in order to produce an averaged gain value;
   (i) for each power section, determining a measure of the deviation of the associated gain values from said averaged gain value;
   (j) rejecting an averaged gain value which has a measure of the deviation which exceeds a predetermined threshold; and
   (k) performing an interpolation using averaged gain values which have not been rejected in order to produce an estimation of said non-linear characteristics of said amplifier.

2. A method according to claim 1, wherein in step (f), a complex gain value of said amplifier, which has a magnitude and a phase is determined, wherein in step (h), the magnitudes and phases are averaged in order to produce an averaged magnitude and an averaged phase for each power section, wherein in step (i), for each power section, a measure of the deviation of the magnitudes from said averaged magnitude and a measure of the deviation of the phases from said averaged phases are determined, wherein in step (j), an averaged magnitude and/or an averaged phase which have a measure of deviation which exceeds a predetermined threshold are rejected and wherein in step (k), an interpolation using averaged magnitudes and averaged phases which have not been rejected is performed in order to produce an AM/AM characteristic and an AM/PM characteristic of said amplifier.

3. A method according to claim 1, wherein the measure of the deviation determined in step (i) is the standard deviation.

4. A method according to claim 1, wherein prior to step (e), frequency shifts, time delays and phase shifts between the reference signal and the measurement signal are corrected.

5. A method according to claim 1, further comprising the step of determining pre-distortion coefficients on the basis of the estimated non-linear characteristic of said amplifier by exchanging input values and output values of said non-linear characteristic of said amplifier.

6. Method according to claim 1, wherein in step (k), an interpolation is performed such that a resolution of the non-linear characteristic of said amplifier is obtained which is finer than the resolution provided by the power sections.

7. An apparatus for estimating a non-linear characteristic of an amplifier, comprising:
   means for determining a reference signal based on the power of an input signal;
   means for determining a measurement signal based on the power of an amplified signal, said amplified signal being said input signal or a signal derived from said input signal amplified by said amplifier;
   means for associating respective samples of said measurement signal with respective samples of said reference signal;
   means for determining a gain value of said amplifier for each sample from the respective sample of said reference signal and said associated sample of said measurement signal;

means for dividing an operating range of said amplifier into a plurality of power sections;

means for averaging the gain values associated with samples of said reference signal which have a power which lies in a respective power section, in order to produce an averaged gain value for each power section;

means for determining a measure of the deviation of the associated gain values from said averaged gain value for each power section;

means for rejecting an averaged gain value which has a measure of the deviation which exceeds a predetermined threshold; and means for performing an interpolation using averaged gain values which have not been rejected in order to produce an estimation of said non-linear characteristics of said amplifier.

8. An apparatus according to claim 7, wherein said means for determining a gain value of said amplifier comprises means for determining a complex gain value of said amplifier, which has a magnitude and a phase, wherein said means for averaging comprises means for averaging the magnitudes and phases in order to produce an averaged magnitude and an averaged phase for each power section, wherein said means for determining a measure of the deviation comprises means for determining a measure of the deviation of the magnitudes from said averaged magnitude and a measure of the deviation of the phases from said averaged phases, wherein said means for rejecting comprises means for rejecting an averaged magnitude and/or an averaged phase which have a measure of deviation which exceeds a predetermined threshold, and wherein said means for performing an interpolation comprises means for performing an interpolation using averaged magnitudes and averaged phases which have not been rejected in order to produce an AM/AM characteristic and an AM/PM characteristic of said amplifier.

9. An apparatus according to claim 7, wherein the measure of the deviation determined is the standard deviation.

10. An apparatus according to claim 7, further comprises means for correcting frequency shifts, time delays and phase shifts between the reference signal and the measurement signal.

11. An apparatus according to claim 7, further comprising means for determining pre-distortion coefficients on the basis of the estimated non-linear characteristic of said amplifier by exchanging input values and output values of said non-linear characteristic of said amplifier.

12. Method according to claim 7, wherein said means for performing an interpolation comprises means for performing an interpolation, such that a resolution of the non-linear characteristic of said amplifier is obtained which is finer than the resolution provided by the power sections.

* * * * *